United States Patent [19]

Murray et al.

[11] Patent Number: 5,670,204

[45] Date of Patent: Sep. 23, 1997

[54] NB—SN PRECURSORS HAVING CONTROLLED IMPURITIES AND METHOD OF MAKING

[75] Inventors: Melissa Lea Murray, Schaghticoke; Bruce Alan Knudsen, Amsterdam, both of N.Y.; Christopher Gus King, Florence, S.C.; Mark Gilbert Benz, Burnt Hills; Robert John Zabala, Schenectady, both of N.Y.; Anthony Mantone, Florence, S.C.

[73] Assignee: General Electric Company, Schenectady, N.Y.

[21] Appl. No.: 494,743

[22] Filed: Jun. 26, 1995

[51] Int. Cl.$^6$ .................................................. B05D 5/12
[52] U.S. Cl. ........................... 427/62; 427/63; 427/431; 427/436; 427/376.8; 505/818
[58] Field of Search ......................... 427/62, 63, 376.8, 427/431, 436; 505/818

[56] References Cited

U.S. PATENT DOCUMENTS

| | | | |
|---|---|---|---|
| 3,416,917 | 12/1968 | DeSorbo | 75/174 |
| 3,429,032 | 2/1969 | Martin et al. | 29/599 |
| 3,537,827 | 11/1970 | Benz et al. | 29/194 |
| 3,661,639 | 5/1972 | Caslaw | 117/213 |
| 3,676,577 | 7/1972 | Merrin et al. | 174/119 R |
| 4,177,087 | 12/1979 | Lee et al. | 148/11.5 R |
| 4,531,982 | 7/1985 | Dubors | 148/11.5 F |
| 4,746,373 | 5/1988 | Yamada et al. | 148/11.5 P |
| 4,966,142 | 10/1990 | Zimmerman et al. | 228/263.12 |
| 5,098,656 | 3/1992 | Zimmerman et al. | 420/526 |
| 5,109,593 | 5/1992 | Benz et al. | 29/544 |
| 5,399,547 | 3/1995 | Negm et al. | 505/430 |
| 5,522,945 | 6/1996 | Murrey et al. | 148/96 |
| 5,540,787 | 7/1996 | Johnson et al. | 148/18 |

OTHER PUBLICATIONS

J.S. Caslaw. Enhancement of the Critical Current Density in Niobium–Tin. Cryogenics, Feb., 1971, pp. 57–59.

D. B. Smathers et al. Scanning Auger Investigation of Commercial Multifilamentary $Nb_3Sn$ Conductors. IEEE Transactions on Magnetics. vol. MAG-19, No. 3, May 1983.

*Primary Examiner*—Benjamin Utech
*Attorney, Agent, or Firm*—Ernest G. Cusick; William H. Pittman

[57] ABSTRACT

Nb—Sn precursor articles are described that include a Nb alloy article that is at least partially coated with a layer of a Sn alloy, such as a Sn—Cu alloy. The precursor articles described herein have a controlled concentration of the impurity elements As and S in the Sn alloy layer. The concentration of these elements in the Sn alloy layer is less than or equal to 50 ppm by weight. This invention also describes a method for making Nb—Sn precursor articles having a controlled concentration of As and S impurities.

14 Claims, 3 Drawing Sheets

NB—SN PRECURSORS HAVING CONTROLLED IMPURITIES AND METHOD OF MAKING

FIELD OF THE INVENTION

This invention is related generally to Nb—Sn precursor articles having controlled levels of certain impurity elements that may be used to form superconductive $Nb_3Sn$, and a method for making these precursor articles. Specifically, the precursor articles comprise articles formed from a Nb alloy, such as a Nb alloy foil or tape, that have a coating layer of a Sn alloy, wherein the Sn alloy has controlled concentrations of S and As. The invention also comprises a method for making these precursor articles, as well as a method for making the resulting superconductive $Nb_3Sn$ articles. The precursor articles and methods of this invention are particularly useful for making superconductive $Nb_3Sn$ foils, tapes or wires.

BACKGROUND OF THE INVENTION

Superconductivity is that characteristic of certain materials which permits them to conduct electric currents without resistance. A superconducting material exhibits this characteristic only when its temperature is below the superconducting critical temperature of the material and then only if it is not subject either to a magnetic field greater than the superconducting critical magnetic field of the material or to an electric current greater than the superconducting critical current of the material. Accordingly, a superconductive material can be quenched (i.e. returned to a resistive state) by increasing the temperature, magnetic field, or current to which the material is subjected above the critical temperature, critical magnetic field, or critical current. In a given material, quenching of the superconductivity may occur abruptly or more gradually depending upon the breadth of its superconducting transition state with respect to temperature, magnetic field or current.

Briefly stated, with regard to metallic superconductors it is known that selected parent-metals, either pure or preferably containing minor solute-metal alloying additions, are capable of being alloyed with other reactive-metals and forming superconducting compounds or alloys that have a high current-carrying capacity. The parent-metals Nb, Ta, Tc, and V can be reacted or alloyed with reactive-metals, such as Sn, Al, Si, and Ga to form superconducting alloys, such as the intermetallic $Nb_3Sn$. One way of forming these metallic superconductors is to form a precursor article comprising a coating of the reactive-metal on an article formed from the parent metal, and then heating the precursor to form a layer or layers of the superconductive compound.

Additionally, it is known that the superconductive characteristics of superconductors formed from various parent-metals can be improved by first alloying the parent-metal, i.e., Nb, Ta, Tc, and V, with a minor amount of a solute-metal having an atom diameter that is at least 0.29 angstroms larger than the diameter of the parent-metal atom, prior to reacting the reactive-metal with the parent-metal. A broad disclosure of various parent-metals, solute-metals, and reactive-metals can be found in U.S. Pat. No. 3,416,917, which is incorporated herein by reference. Of the various possible combinations of the materials mentioned above, it is known that Nb is an extremely useful parent-metal, particularly when reacted with the reactive-metal, Sn to form $Nb_3$ Sn. This intermetallic compound has superior superconducting properties. More specifically, U.S. Pat. No. 3,429,032, which is incorporated herein by reference, discloses improved critical currents in superconductive $Nb_3Sn$ alloys formed when the parent-metal Nb also contains zirconium, in an amount of at least 0.1 weight percent and up to an amount equivalent to the ratio represented by the formula $Nb_2Zr$, and is heated in the presence of excess Sn and a non-metal selected from the group consisting of O, N, and C.

Metallic superconductors, particularly those comprising $Nb_3Sn$, have been fabricated in various forms, particularly wires and foils in the form of tapes, for use in devices such as high field superconducting electromagnets. Superconductive $Nb_3Sn$ articles of laminated construction having an elongated tape or strip configuration and the methods of producing such tapes are well known. For example, British patent 1,254,542 incorporated by reference herein, discloses improved $Nb_3Sn$ tapes, and methods of forming the improved tapes. U.S. Pat. No. 3,537,827, incorporated by reference herein, discloses improvements in laminating superconductive $Nb_3Sn$ tapes and methods for producing the laminated tapes. One method for obtaining superconductive $Nb_3Sn$ tape in a continuous fashion is that wherein a tape of Nb or a Nb alloy (e.g. an Nb—Zr—O alloy) as a parent-metal is continuously fed through a bath of molten Sn or a Sn alloy (e.g. a Sn—Cu alloy) as a reactive-metal. The Nb tape picks up a thin coating of Sn from the molten bath forming a precursor tape. This precursor tape is subsequently heated in a reaction furnace to cause the formation of a superconductive tape comprising $Nb_3Sn$ alloy on the surfaces of the remaining Nb tape. It is also known that the reactive-metals can be alloyed to further improve the superconductive tape. For example, the critical current density of $Nb_3Sn$ has been improved by making Cu additions of up to 45 weight percent Cu in the reactive-metal Sn used to coat the Nb tape as disclosed in, "Enhancement of the Critical Current Density in Nb—Sn" J. S. Caslaw, Cryogenics, February 1971, pp. 57–59.

Previously, the addition of alloying elements to Nb—Sn precursor articles in order to increase the rate of formation or superconductive characteristics of the superconductive $Nb_3Sn$, have been reported. For example, the addition of oxygen to Nb parent-metal alloys containing zirconium alloying additions have been recognized as a means of increasing the rate of formation of $Nb_3Sn$. The use of Cu—Sn reactive-metal alloys as described above is an example of making alloying additions to enhance the superconductive electrical characteristics of $Nb_3Sn$. However, even with the use of such alloying additions, variability in the thickness of $Nb_3Sn$ layers in reacted precursor tapes has been observed that suggested heretofore unrecognized reaction mechanisms associated with the constituent elements of the precursor articles that affect the formation of $Nb_3Sn$. Therefore, it is desirable to identify these constituent elements so that their concentrations may be controlled within the Nb—Sn precursor article so as to increase the rate of formation or enhance the superconductive characteristics of the $Nb_3Sn$, formed from these articles. Thus it is desirable to identify improved Nb—Sn precursor articles and methods for their manufacture.

SUMMARY OF THE INVENTION

The present invention is a Nb—Sn precursor article with controlled levels of impurities that hinder the formation of $Nb_3Sn$ when the precursor is reacted.

This invention may be described briefly as a Nb—Sn precursor article having controlled concentrations of impurity elements, comprising: a Nb alloy article having an outer surface; and a layer of a Sn alloy coating at least a portion of the outer surface of said Nb alloy article, said Sn alloy layer having a maximum concentration of any of the impurity elements S and As that is less than or equal to 50 ppm by weight.

The invention also comprises a method for making a Nb—Sn precursor article having controlled concentrations of impurity elements, comprising the steps of: selecting a Nb alloy article having an outer surface; and coating at least a portion of the outer surface of the Nb alloy article with a layer of a Sn alloy having a maximum concentration of any of the impurity elements S and As that is less than or equal to 50 ppm by weight.

While improvements have been observed by controlling impurities at the concentrations noted, it is preferable that the maximum concentration of any of the impurity elements be controlled to 10 ppm by weight or less. Nb—Sn precursor articles having controlled impurities and methods of making these articles are particularly advantageous because they tend to optimize the formation of $Nb_3Sn$ articles, either by increasing the rate of formation, the consistency of the thickness of the $Nb_3Sn$ layer, or both.

DETAILED DESCRIPTION OF THE INVENTION

Figure 1:
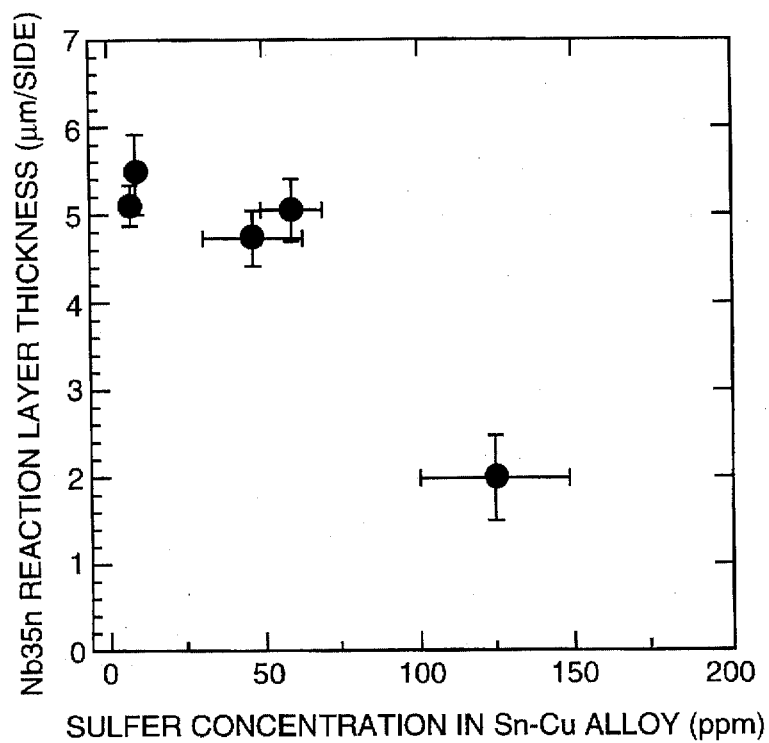
FIG. 1 is a plot of the $Nb_3Sn$ layer thickness on a reacted Nb tape as a function of the S concentration in the Sn alloy bath into which the Nb tape was dipped, and hence the S concentration in the Sn alloy coating on the unreacted tape.

The present invention comprises Nb—Sn precursor articles having controlled concentrations of certain impurity elements that may be used to form articles having a layer or layers of superconductive $Nb_3Sn$. Applicants have discovered that increasing concentrations of these impurity elements slows the formation of $Nb_3Sn$ when the precursor is reacted This invention may be described briefly as a Nb—Sn precursor article having controlled concentrations of impurity elements, comprising: a Nb alloy article having an outer surface; and a layer of a Sn alloy coating at least a portion of the outer surface of said Nb alloy article, said Sn alloy layer having a maximum concentration of any of the impurity elements S and As that is less than or equal to 50 ppm by weight.

The invention also comprises a method for making a Nb—Sn precursor article having controlled concentrations of impurity elements, comprising the steps of: selecting a Nb alloy article having an outer surface; and coating at least a portion of the outer surface of the Nb alloy article with a layer of a Sn alloy having a maximum concentration of any of the impurity elements S and As that is less than or equal to 50 ppm by weight.

The precursor articles of the present invention are precursors for forming superconductive articles comprising $Nb_3Sn$. These precursor articles comprise a Nb alloy article having an outer surface, and a layer of a Sn alloy coating at least a portion of the outer surface of the Nb alloy article. The Nb alloy articles described frequently comprise Nb alloy tapes, foils, or wires, but may comprise any Nb alloy article on which it is desired to produce a superconductive $Nb_3Sn$ layer on the surface of the article. The Sn alloy coating on the outer surface of the precursor article is typically on the order of 5–20 microns in thickness. This layer may be applied to the entire outer surface of the Nb alloy article, or merely a portion of the Nb alloy article, depending on the desired location and configuration of the superconductive $Nb_3Sn$ layer. In the case of Nb alloy tapes, the Sn alloy layer is usually applied so as to coat the entire outer surface of the article or both sides of the tape.

Niobium alloy articles of the present invention may comprise a number of different alloy compositions as described in the patents incorporated by reference herein. A more preferred range of alloy compositions include those alloys comprising up to about 5 at. % Zr, up to about 10 at. % O and a balance of Nb. In the case of Nb alloy articles in the form of tapes, a most preferred composition comprises Nb—1Zr—2O, in at. %. This alloy composition is known, and may be formed by several methods, including the one described briefly herein. This alloy composition is particularly desired because superconductive $Nb_3Sn$ tapes formed therefrom are known to have particularly desirable superconducting properties in the form of an optimized current density.

A Sn alloy layer coating the appropriate portion of the Nb alloy article may comprise any Sn alloy which may be reacted with the Nb alloy article to produce superconductive $Nb_3Sn$. A preferred family of alloys are Sn—Cu alloys comprising up to about 40 at. % Cu, and the balance Sn. A most preferred Sn alloy composition, that is particularly suited for Nb alloy articles in the form of tapes comprising Nb—1Zr—2O, in at. %, is the alloy composition comprising Sn—17Cu, in at. %.

The coating of the Sn alloy may be applied to the desired portion of the outer surface of the Nb alloy article by a number of known methods, such as immersion in a molten bath, plating or other suitable methods. In the case of Nb alloy tapes, it is preferred to coat an outer surface of the Nb alloy article with the Sn alloy by immersing the portion of the outer surface of the Nb alloy article on which the coating is to be applied in a molten bath of the Sn alloy. The conditions for applying such Sn alloy coatings are well known, and are described briefly herein.

According to this invention, the concentration of the impurity elements As and S in the Sn alloy layer, should have a maximum concentration of any of these elements of 50 ppm by weight or less, because of the detrimental effect that such elements play in the formation of $Nb_3Sn$ when the precursor articles are reacted to form the superconductive material, as described further herein. Further, it is preferred that the concentration of the impurity elements S and As be controlled such that the maximum concentration of any of these elements is 10 ppm by weight, or less, in order to further facilitate the formation $Nb_3Sn$.

A method for making Nb—Sn precursor articles of the present invention comprises selecting a Nb alloy article and coating at least a portion of the outer surface of the Nb alloy article with a layer of a Sn alloy with a maximum concentration of any of the impurity elements S and As that is 50 ppm by weight, or less. The Nb alloy article should be selected so as to provide a desired configuration of the desired superconductive article once the Nb alloy article has been reacted to form $Nb_3Sn$, because it is known that $Nb_3Sn$ articles are brittle and hard to form. As an example, it is known to select Nb alloy tapes that will ultimately be reacted to form superconductive $Nb_3Sn$ tapes, as described herein. Preferred Nb alloy compositions for selection are described herein. In particular, the Nb alloy article should be selected such that at least a portion of the outer surface may be coated with a Sn alloy layer.

The step of coating at least a portion of the outer surface of the Nb alloy article with a layer of a Sn alloy may be accomplished by suitable means, including immersion in a molten Sn alloy bath, plating from a solution containing the desired Sn alloy constituents, or vapor deposition.

The step of coating should apply a layer of the Sn alloy having a maximum concentration of any of the impurity elements S and As that is less than or equal to 50 ppm by weight, as explained further herein. In the case of applying the Sn alloy layer by passing the Nb alloy article through a molten bath of the Sn alloy, the maximum concentration of the impurity elements mentioned may be controlled so as to not exceed the maximum concentration by several methods. One method involves the removal of S and As from the molten bath so as to achieve a concentration of the impurity elements that is less than or equal to the maximum concentration permitted. This may be done by the applying a gettering material to the molten Sn alloy bath. Nb alloy gettering materials are preferred for the removal of As and S from Sn—Cu alloy baths, because Nb serves to getter both S and As from such baths, as described herein. The amount and configuration of the getter material may be calculated by known means, as described herein.

Another method for controlling the maximum concentration of the impurity elements, is to control the materials that are used to form the molten Sn alloy bath. Such methods are well known, and involve determining the concentration of these impurity elements in the starting materials which are used to form the Sn alloy bath, as is also described herein.

The method of this invention may also be extended to describe a method for making superconductive $Nb_3Sn$ by the additional step of heating the precursor article at a temperature and a time sufficient to form a layer of $Nb_3Sn$. These temperatures and times are well known, for example, in the case of tape precursor articles, typical reaction conditions comprise 1050° C. for about 190 seconds in an Ar atmosphere.

EXAMPLE 1

The affect of S and As on the reaction kinetics of $Nb_3Sn$ was studied using precursor Nb tapes coated with a Sn/Cu alloy containing controlled levels of these elements. These precursor tapes were reacted to form $Nb_3Sn$. The reacted tapes were also evaluated to determine the affect of these elements on the superconductive electrical properties, including critical current and critical current density.

Processing the Superconducting Tape

The affects of As and S were studied using long lengths of Nb—1 Zr (at. %) tape that were 2.54 cm (1.0 in) wide by 0.00254 cm (0.001 in) thick. These tapes were then: 1) cleaned to remove grease on surface of the tape; 2) knurled to roughen the surface of the tape; 3) anodized to add 2 at. % 0 at the surface of the tapes; 4) annealed to decompose the anodic film and diffuse the oxygen into the tape; and 5) Sn dipped in a Sn—17 Cu (at. %) alloy doped with S or As in varying concentrations. These precursor tapes were then cut into smaller lengths (about 33 cm) and given a typical reaction anneal at 1050° C. for 190 sec in an Ar atmosphere to react the tape and form superconductive $Nb_3Sn$. Each side of the reacted tapes had an outer layer of the remaining Sn—Cu alloy and an inner layer of $Nb_3Sn$, as well as a core of the remaining Nb tape. The reacted tapes were evaluated metallographically and electrically to determine the affect of the impurity additions on the thickness of the $Nb_3Sn$ reaction layer and the superconducting properties of the tapes.

Addition of Impurities

To illustrate the affect of S and As impurities, these elements were added to the Sn—17 Cu alloy used in the Sn dipping operation referred to above, either before melting the alloy to fill the Sn dip apparatus or during operation of the Sn dip apparatus. S was added in the form of 90% pure Cu sulfide ($Cu_2S$) powder. As was added as pure As powder. Table 1 summarizes the amounts added and the tapes used in the Sn dip operation. In most cases, the amount of impurity in the Sn alloy was chemically analyzed. Sn alloy samples were

TABLE 1

Tin Bath Impurity Concentrations

| ARSENIC | | | SULFUR | | |
|---|---|---|---|---|---|
| Tape ID | Added (ppm) | Measured (ppm) | Tape ID | Added (ppm) | Measured (ppm) |
| 92-174A | 0 | 3.0 ± 0.5 | 17-1-92-1 | 0 | 6.7 ± 2.0 |
| 92-174A | 10 | — | 17-1-92-1 | 0 | 8.3 ± 1.0 |
| 92-174A | 60 | — | 17-1-92-1 | 30 | 67.0 ± 19 |
| 17-1-92-1 | — | 75.0 ± 9.0 | 17-1-92-1 | 50 | 62.0 ± 14 |
| 17-1-92-1 | — | 218.0 ± 9.0 | 17-1-92-1 | 100 | 150.0 ± 70 | obtained at the end of a Sn dip by quenching liquid droplets of Sn alloy on a cold plate. S analysis was performed using a LECO RS-244 S analyzer with an instrument accuracy of ±5%. Values reported for S content represent an average of at least three measurements on the analyzer. Table 1 shows, however, some differences in the amount of impurities added and the measured values. This discrepancy could be attributable to segregation in the sample during solidification, error in the measurement of the added amount or other mechanisms. The As concentration was measured using known methods such as atomic absorption spectroscopy (AAS) or inductive coupled plasma (ICP).

Testing the Effect of Impurities

The thickness of the $Nb_3Sn$ layer formed during the reaction anneal was measured for both impurity elements. This measurement was performed by observing a fracture cross-section of the reacted tape with a Cambridge Instruments Stereoscan 240 scanning electron microscope (SEM). The resulting thicknesses were compared with a baseline tape where neither of these elements was added.

For the As additions, the superconducting critical current and critical current density of the resulting tapes were also measured to determine the effect of this element on the superconductive electrical properties. For the electrical measurements, the measurements were made on strips of reacted tape 7.6 cm long by 3 mm wide. The critical current measurements were made at 4.2K and 5 T with the magnetic field perpendicular to the current path and parallel to the wide side of the $Nb_3Sn$ tape. The critical current was defined as the current where the voltage drop across 1 cm of sample length exceeded 0.2 µV. The critical current density was calculated according to the formula:

$$J_c = \frac{I_c/w}{2(\delta_{Nb_3Sn})}$$

where $I_c/w$ is the critical current per unit width of superconductor and $\delta_{Nb_3Sn}$ is the $Nb_3Sn$ layer thickness per side.

In addition, the tapes were analyzed using both optical metallography and the SEM to determine where the impurities were concentrated. For the As additions, a 0.15 cm (0.06 in) thick Nb "getter" plate was dipped for 4 hrs in the Sn alloy prior to coating the Nb tape, a procedure often performed in Sn dip practice when coating Nb alloys to dissolve Nb into the Sn alloy. This procedure was done to get the data of FIG. 2. This procedure was not done for FIG. 3. Typically the amount of Nb dissolved into the Sn dip alloy is approximately 0.1% by weight. Cross-sections of these Sn-coated Nb plates were analyzed qualitatively using backscattered electron imaging (BSE) and energy dispersive spectrometry (EDS). To determine the regions where the S was concentrated, etching experiments were performed on the reacted tapes that had been exposed to varying concentrations of S. These tapes were analyzed for S using the methods described herein, etched to remove subsequent alloy layers, and re-analyzed to determine the S concentration. To remove the outer Sn/Cu alloy layer, the etching procedure used a combination of dilute $HNO_3$ and HCl baths. Removal of the $Nb_3Sn$ was achieved with a solution of water, HF, $H_2SO_4$ and $HNO_3$. Using this etching method, the concentration of S in the $Nb_3Sn$ layer and in the Nb core were determined.

Effect of S

The analysis/etching procedure described above was performed on reacted tape 17-1-92-1 which had been Sn dipped in a Sn alloy bath containing 100 ppm S. The S content of the reacted tape was measured after removing the Sn/Cu alloy layer. An etch to remove the $Nb_3Sn$ layer allowed an analysis of the S content in the Nb core. The following results were obtained:

$S_T$=960 ppm
$S_{Nb}$=34 ppm
$\delta_{Nb}$=15 µm
$\delta_{Nb_3Sn}$=2×(2 µm)

where $S_T$ is the S content in the tape with the Sn alloy etched away, $S_{Nb}$ is the S content in the Nb core, $\delta_{Nb}$ is the thickness of the Nb core, and $\delta_{Nb_3Sn}$ is the total thickness of the $Nb_3Sn$ layers (one layer on each side of the Nb core). The equation that relates these measurements is:

$$S_T = S_{Nb}\left(\frac{\rho_{Nb}\delta_{Nb}}{M_T}\right) + S_{Nb3Sn}\left(\frac{\rho_{Nb_3Sn}\delta_{Nb_3Sn}}{M_T}\right)$$

where $M_T$ is the total mass of the sample per unit width per unit length and $\rho$ is the density. From this equation, the S content in the $Nb_3Sn$ layer is:

$S_{Nb_3Sn}$=0.44 wt %
=1.3 at. %.

The results indicate that a small amount of S diffused into the Nb tape. Before the Sn dip, the S content of the Nb alloy tape was about 15 ppm and after dipping the S content increased to 34 ppm. However, after the reaction anneal, a very large concentration of S, 1.3 at. % (4400 ppm by weight) was found in the $Nb_3Sn$ layer. Thus, Nb may be used as a gettering material to remove S from a Sn dip bath, as is described with respect to As in more detail below.

The effect of S on the reaction kinetics is shown in FIG. 1. For tapes reacted at the same temperature for the same amount of time, the addition of 100–150 ppm S to the Sn bath reduced the resulting $Nb_3Sn$ reaction layer thickness by about 70%. The addition of smaller amounts of S produced a similar but smaller reduction in the thickness of the $Nb_3Sn$ reaction layer.

Effect of As

Figure 2:
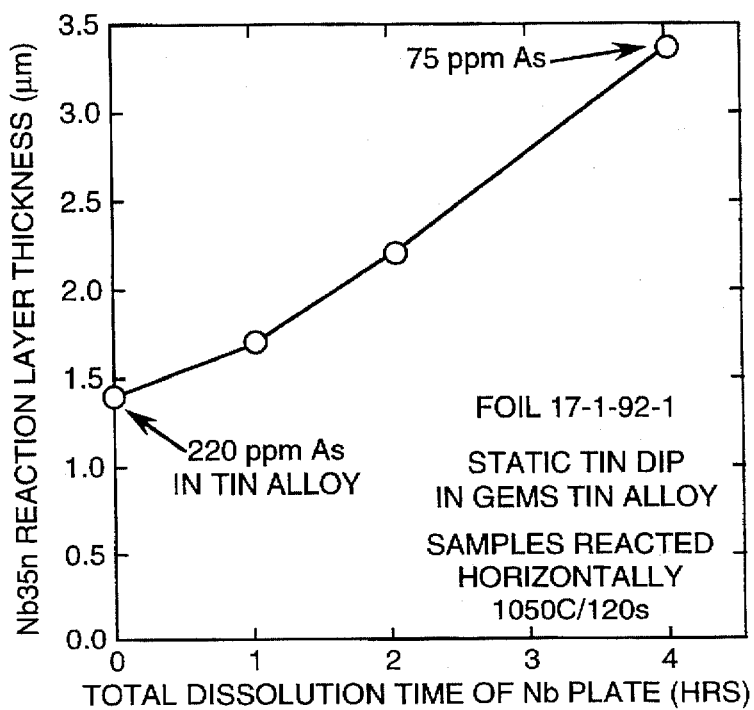
FIG. 2 is a plot of the $Nb_3Sn$ layer thickness on a reacted Nb tape as a function of the duration of immersion of a Nb plate as a getter for As in the Sn dip bath, and thus indirectly as a function of the As concentration in the Sn dip bath.
Figure 3:
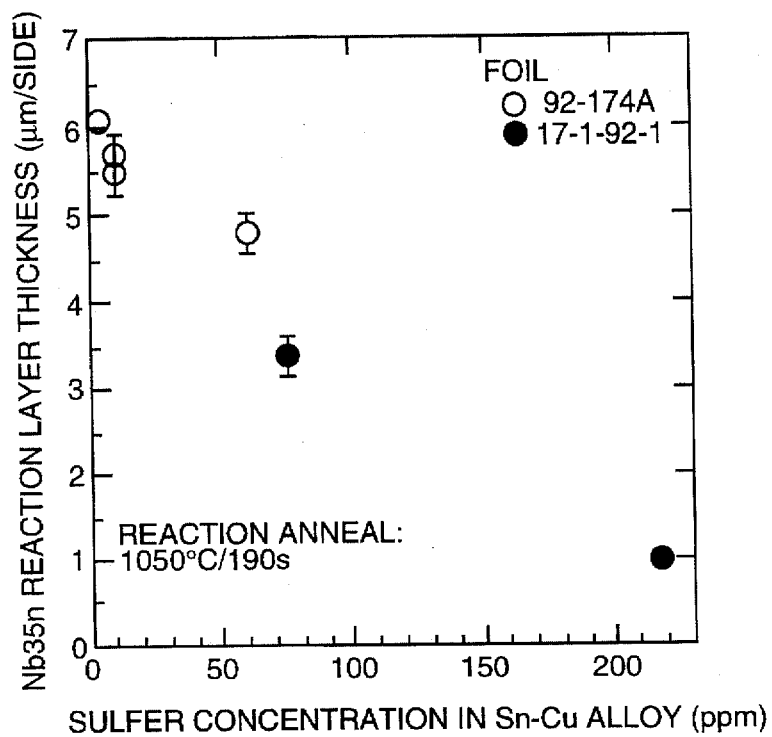
FIG. 3 is a plot of the $Nb_3Sn$ layer thickness on a reacted Nb tape as a function of the As concentration in the Sn alloy bath into which the Nb tape was dipped, and hence the As concentration in the Sn alloy coating on the unreacted tape.
Figure 4:
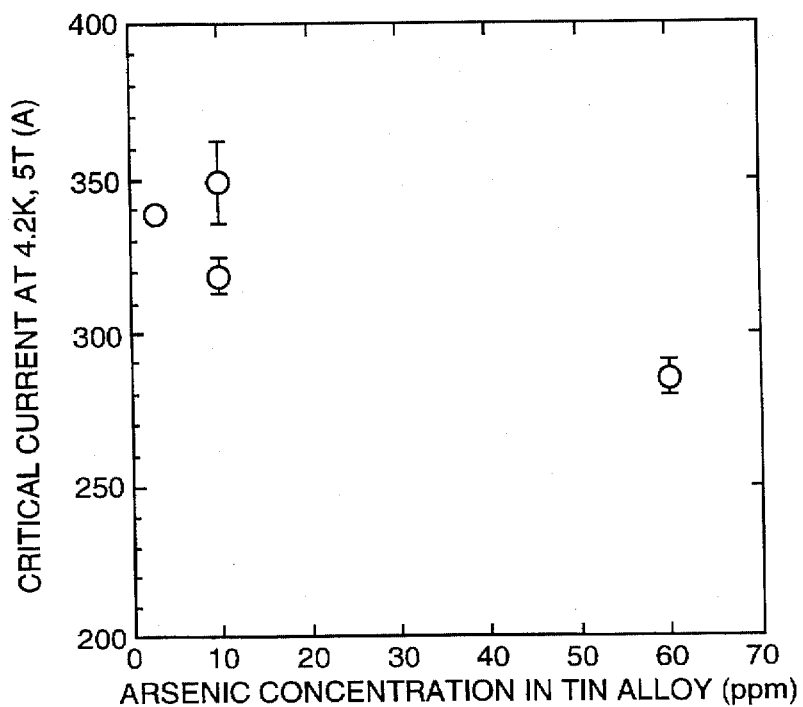
FIG. 4 is a plot of the critical current in a reacted tape as a function of the As concentration in the Sn alloy bath into which the Nb tape was dipped, and hence the As concentration in the Sn alloy coating on the unreacted
Figure 5:
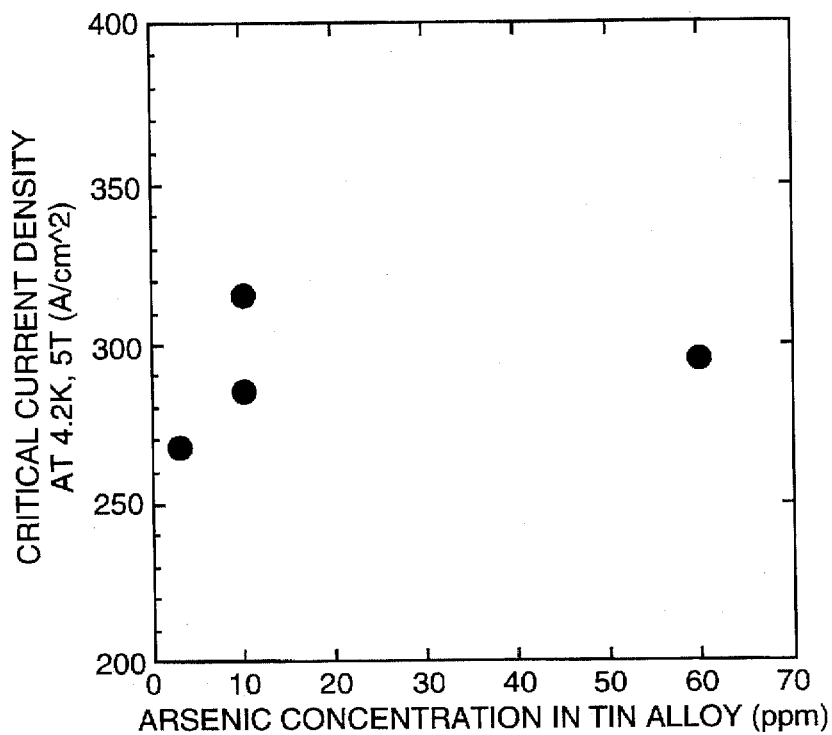
FIG. 5 is a plot of the critical current density in a reacted tape as a function of the As concentration in the Sn alloy bath into which the Nb tape was dipped, and hence the As concentration in the Sn alloy coating on the unreacted tape.

As shown in FIG. 2, observations of solid Nb plates that had been dipped in the Sn baths that contained As indicate that the Nb plates act as a "getter" for As. A 2.5×2.5×0.15 cm (1.0×1.0×0.06 in) Nb plate was dipped for 4 hrs in a Sn-17 at. % Cu alloy that contained about 220 ppm As. The total mass of the Sn alloy was 2.3 kg (5 lbs) and the temperature of the melt was 1050° C. This plate was sectioned and analyzed using BSE and EDS which showed medium-grey-colored Nb—As dendrites growing vertically from the Nb surface of the plate. Since a Nb—As phase diagram is not available, the resulting Nb—As compound could not be accurately determined without further analysis. Measurements of the As concentration in the Sn bath after the four-hour dip revealed a reduction in the As content of about 65% to 75 ppm As. To determine whether similar Nb—As dendrites formed on the Sn-dipped tape, the Nb—1Zr—2O (at. %) alloy tape was dipped using the normal Sn dip process (2–3 sec immersion time) in a similarly doped Sn alloy. However, analysis with BSE and EDS revealed no Nb—As dendrites in the Sn alloy layer of this tape. This absence of As could be due to the small amount of time the tape was immersed in the melt and the detection limits of the instrument. With respect to the $Nb_3Sn$ reaction kinetics, the addition of As to the Sn alloy bath reduced the reaction layer thickness produced on a tape reacted at 1050° C. for 190 sec by an amount similar to that of the S additions, as shown in FIG. 3. In addition to the thinner $Nb_3Sn$ layer, oversized $Nb_3Sn$ grains (approximately 3 microns in diameter) also appear, as contrasted with a fine grain (0.2–0.5 microns in diameter) microstructure that typically exists in the $Nb_3Sn$ reaction layer in the absence of impurity elements such as S and As. FIG. 3 shows the variation of the reaction layer thickness as a function of the As concentration in the Sn—Cu alloy. The critical current was also measured as a function of the As additions to the Sn—Cu alloy, as shown in FIG. 4. However, a reduction in the critical current density was not observed. FIG. 5 shows that the critical current density actually increases slightly with added As (10 to 60 ppm).

Kinetics of $Nb_3Sn$ Formation in the Presence of S and As

Figure 6:
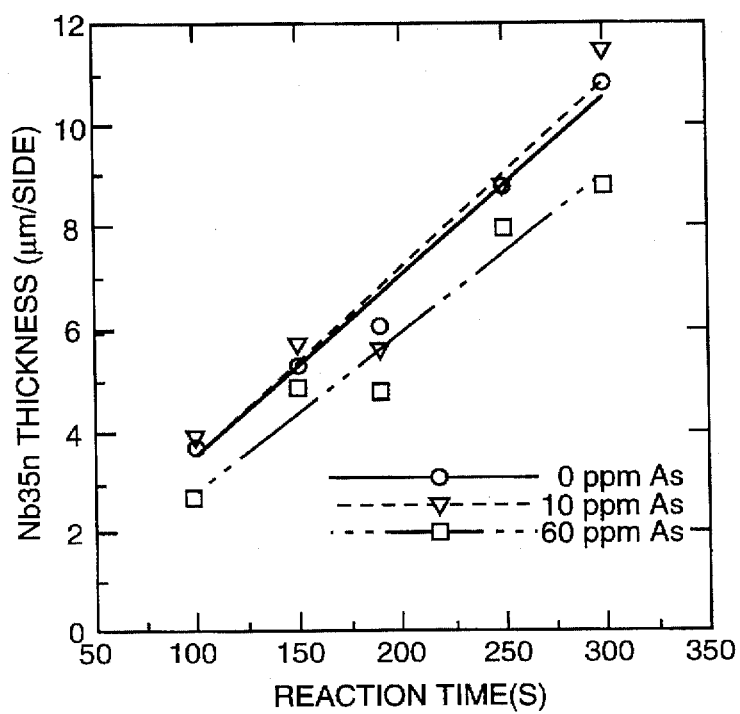
FIG. 6 comprises plots of the $Nb_3Sn$ layer thickness as a function of reaction time at various As concentrations.

Applicants have observed that the typical growth of $Nb_3Sn$ on Nb tapes is linear when considering the thickness of the $Nb_3Sn$ reaction layer as a function of the reaction time; indicating that the rate-limiting step in the formation of $Nb_3Sn$ is the reaction at the Nb—$Nb_3Sn$ interface. For different concentrations of As in the Sn alloy, the $Nb_3Sn$ growth curve is also linear as shown in FIG. 6. A linear rate of $Nb_3Sn$ growth also appears for As concentrations of 10 ppm and 60 ppm. The 10 ppm addition does not affect the reaction rate, but the 60 ppm appears to decrease the reaction rate by a constant amount (about 15%). Since the reaction rate with 60 ppm As dopant remains linear with a slightly diminished slope, the impurity is probably slowing the reaction between Nb and Sn. Without limitation, the competition between the formation of Nb$_3$Sn and a Nb—As compound could be the cause of the decreased Nb$_3$Sn layer growth. Without limitation, S also seems to also slow the reaction between Nb and Sn in a similar way, perhaps by forming a Nb- or Sn-sulfide.

Since FIG. 1 shows that concentrations of as little as 50 ppm S or more in the Sn dip alloy can reduce the subsequent reaction kinetics of Nb tape that is dipped in this alloy, it is desirable to control the concentration of this impurity element in the Sn dip bath, and hence the Sn alloy coating on the Nb article, at levels that are less than or equal to 50 ppm. Further, Applicants believe that a lower control limit of about 10 ppm or less is most preferred, because the data of FIG. 1 shows that this concentration improves the rate of formation of the Nb$_3$Sn. A concentration of approximately 10 ppm S was achieved when the Sn dip bath was prepared using 99.999% purity Sn. A reduced concentration of S may be possible by using Sn with even a greater purity as the starting material, however, the costs of using higher purity starting materials may not yield an economic benefit great enough to justify their use.

As may be seen in FIG. 3, the presence of As at concentrations of about 60 ppm or greater in the Sn alloy also slows the formation of Nb$_3$Sn. Even an As concentration of 10 ppm affects the rate of formation of Nb$_3$Sn, slowing the reaction rate by approximately 10%. The amount of deterioration is similar to that produced by S, and for practical considerations, it is probably sufficient to establish the same control limits for both impurity elements. As may be seen in FIG. 5, the critical current density was not affected significantly by As concentrations of 10 to 60 ppm in the Sn dip alloy. For 10 ppm As, the critical current density was observed to increase by 10%. When S is present in the Sn alloy used to coat Nb precursor tapes, the impurity is observed to concentrate in the Nb$_3$Sn layer after the reaction anneal. While the location of As in reacted tapes was not determined in these experiments, it is clear that As impurities also have a significant affect on the resultant Nb$_3$Sn in reacted tapes.

Therefore, it is desirable to control the amount of S and As in the Sn alloy coating on the unreacted Nb tapes and hence, in a Sn dip operation, because they slow the formation of Nb$_3$Sn when the tape is reacted. This may be done, when using a Sn dip bath or other method of applying the n alloy coating, by selecting starting materials (Sn and Cu) when preparing the Sn dip alloy that yield the desired concentrations of these elements. Since As is commonly found as an impurity in both Cu and n, this may be the most direct method of controlling the concentration of As. Likewise, is also a known impurity in both n and Cu, and thus the concentration of this impurity may also be controlled by the selection of starting materials for the Sn alloy bath that have the desired concentrations of this element. Another method of controlling the concentration of As and Sn, particularly when using dipping in a molten bath as the method of applying the Sn alloy coating, is to dip a gettering material into the molten bath once it has been prepared. It is preferred that the gettering material remove all of the desired impurity elements, as is the case with respect to the use of a Nb getter to remove both S and As, and that dissolution of the gettering material does not itself add undesirable contaminants to the molten bath.

The preceding description and example are intended to be illustrative, and not exhaustive as to the articles and methods of the present invention.

What is claimed is:

1. A method for making a Nb—Sn precursor article, the method comprising the steps of:

selecting a Nb alloy article having an outer surface; and
   coating at least a portion of the outer surface of the Nb alloy article with a layer of a Sn alloy having an impurity element selected from the group consisting of S and As, wherein the maximum concentration of each impurity is less than or equal to about 50 ppm by weight.

2. The method of claim 1, wherein said coating comprises passing the Nb alloy article through a molten bath of the Sn alloy, and wherein a concentration of the impurity elements in the molten bath is controlled to not exceed the maximum concentration of the impurity elements.

3. The method of claim 2, wherein the maximum concentration of impurity elements in the molten bath is controlled by removing impurity elements from the molten bath.

4. The method of claim 3 wherein removing excess impurity elements is accomplished by inserting a gettering material into the molten bath.

5. The method of claim 4 wherein the gettering material comprises a Nb alloy.

6. The method of claim 2, wherein the maximum concentration of impurity elements in the molten bath is controlled by selecting materials for making the bath that collectively yield a concentration of impurity elements in the molten bath that is less than or equal to the maximum concentration of the impurity elements.

7. The method of claim 1, wherein the Nb alloy article comprises an alloy of up to about 5 at. % Zr, up to about 10 at. % O and a balance of Nb, and the Sn alloy comprises up to about 40 at. % Cu and the balance Sn.

8. The method of claim 7, wherein the maximum concentration of either of the impurity elements is less than or equal to about 10 ppm by weight.

9. A method for making a superconductive Nb$_3$Sn article, comprising the steps of:

selecting a Nb alloy article having an outer surface;
   coating at least a portion of the outer surface of the Nb alloy article with a layer of a Sn alloy having an impurity element selected from the group consisting of S and As, wherein the maximum concentration of each impurity element is less than or equal to 50 ppm by weight, and wherein the Nb alloy article and the Sn alloy layer comprise a precursor article; and
   heating the precursor article at a temperature and for a time sufficient to form a layer of Nb$_3$Sn.

10. The method of claim 9, wherein said coating comprises passing the Nb alloy article through a molten bath of the Sn alloy, and wherein a concentration of the impurity elements in the molten bath is controlled to not exceed a maximum concentration of impurity elements desired in the Sn alloy layer.

11. The method of claim 10, wherein the concentration of impurity elements in the molten bath is controlled by removing excess impurity elements from the molten bath.

12. The method of claim 10, wherein the concentration of impurity elements in the molten bath is controlled by selecting materials for making the bath that collectively yield a concentration of impurity elements in the molten bath that is less than or equal to the maximum concentration of the impurity elements.

13. The method of claim 9, wherein the Nb alloy article comprises an alloy of up to about 5 at. % Zr, up to about 10 at. % oxygen and a balance of Nb, and the Sn alloy layer comprises up to about 40 at. % Cu and the balance Sn.

14. The method of claim 13, wherein the maximum concentration of each of the impurity elements is less than or equal to about 10 ppm by weight.

* * * * *